US011490027B2

(12) United States Patent
Xin et al.

(10) Patent No.: US 11,490,027 B2
(45) Date of Patent: Nov. 1, 2022

(54) EXTENDED DYNAMIC RANGE IMAGE CAPTURE DEVICE BASED ON A CODED SPATIAL LIGHT TRANSMITTANCE MODULATOR

(71) Applicant: Black Sesame International Holding Limited, Santa Clara, CA (US)

(72) Inventors: Zhaowei Xin, Henan (CN); Hui Pan, San Jose, CA (US)

(73) Assignee: Black Sesame Technologies Inc., San Jose, CA (US)

( * ) Notice: Subject to any disclaimer, the term of this patent is extended or adjusted under 35 U.S.C. 154(b) by 120 days.

(21) Appl. No.: 17/079,198

(22) Filed: Oct. 23, 2020

(65) Prior Publication Data

US 2022/0132017 A1    Apr. 28, 2022

(51) Int. Cl.
    *H04N 5/235*    (2006.01)
(52) U.S. Cl.
    CPC ......... *H04N 5/2355* (2013.01); *H04N 5/2352* (2013.01)

(58) Field of Classification Search
    CPC .......................... H04N 5/2355; H04N 5/2352
    See application file for complete search history.

(56) References Cited

U.S. PATENT DOCUMENTS

| | | | |
|---|---|---|---|
| 6,233,035 B1* | 5/2001 | Toshiyuki | H04N 13/211 |
| | | | 348/E13.028 |
| 2007/0081815 A1* | 4/2007 | Zomet | H04N 5/2259 |
| | | | 396/323 |
| 2016/0316142 A1* | 10/2016 | Sangu | H04N 5/238 |
| 2017/0070709 A1* | 3/2017 | Sato | H04N 5/23203 |

* cited by examiner

*Primary Examiner* — Gevell V Selby
(74) *Attorney, Agent, or Firm* — Timothy T. Wang; Ni, Wang & Massand, PLLC

(57) ABSTRACT

A high dynamic range sensor, comprising a pixel array, having a plurality of pixels, a spatial light transmittance modulator, the spatial light transmittance modulator having a plurality of pre-defined shadings, the plurality of pre-defined shadings are fixed with respect to the plurality of pixels, wherein the plurality of pre-defined shadings is located above the plurality of pixels and a micro-lens array, having a plurality of micro-lens aligned to at least one of the plurality of pixels, wherein the micro-lens array is located above the plurality of pixels.

14 Claims, 17 Drawing Sheets

EXTENDED DYNAMIC RANGE IMAGE CAPTURE DEVICE BASED ON A CODED SPATIAL LIGHT TRANSMITTANCE MODULATOR

BACKGROUND

Technical Field

The instant disclosure is related to an image capture device and specifically to a coded spatial light transmittance modulator based image capture device.

Background

Semiconductor image sensors are used to sense radiation of light. The dynamic range of photodetector is limited by the noise in an analog to digital conversion. Currently, it is difficult to sense poorly lit and brightly lit scene areas simultaneously.

Currently the fusing of multi-exposure low dynamic range images necessitates the use of motion stabilization and de-ghosting. Extending the dynamic range of sensors with multi-exposure images necessitates camera alignment and reduces frame rates. The utilization of multiple sensors to extend the dynamic rage by fusing varying exposures with multiple sensors necessitates the utilization of multiple sensor and complicates camera calibration.

SUMMARY

An example high dynamic range sensor, comprising a pixel array, having a plurality of pixels, a spatial light transmittance modulator, the spatial light transmittance modulator having a plurality of pre-defined shadings, the plurality of pre-defined shadings are fixed with respect to the plurality of pixels, wherein the plurality of pre-defined shadings is located above the plurality of pixels and a micro-lens array, having a plurality of micro-lens aligned to at least one of the plurality of pixels, wherein the micro-lens array is located above the plurality of pixels.

An example method of high dynamic range sensing, comprising receiving from a pixel array a pixel array signal, determining within the pixel array signal an at least one overexposed pixel and modulating at least one grayscaling of a spatial light transmittance modulator to decrease an exposure of the at least one overexposed pixel.

DETAILED DESCRIPTION OF THE INVENTION

The embodiments listed below are written only to illustrate the applications of this apparatus and method, not to limit the scope. The equivalent form of modifications towards this apparatus and method shall be categorized as within the scope the claims.

Certain terms are used throughout the following description and claims to refer to particular system components. As one skilled in the art will appreciate, different companies may refer to a component and/or method by different names. This document does not intend to distinguish between components and/or methods that differ in name but not in function.

In the following discussion and in the claims, the terms "including" and "comprising" are used in an open-ended fashion, and thus may be interpreted to mean "including, but not limited to . . . ." Also, the term "couple" or "couples" is intended to mean either an indirect or direct connection. Thus, if a first device couples to a second device that connection may be through a direct connection or through an indirect connection via other devices and connections.

Figure 1:
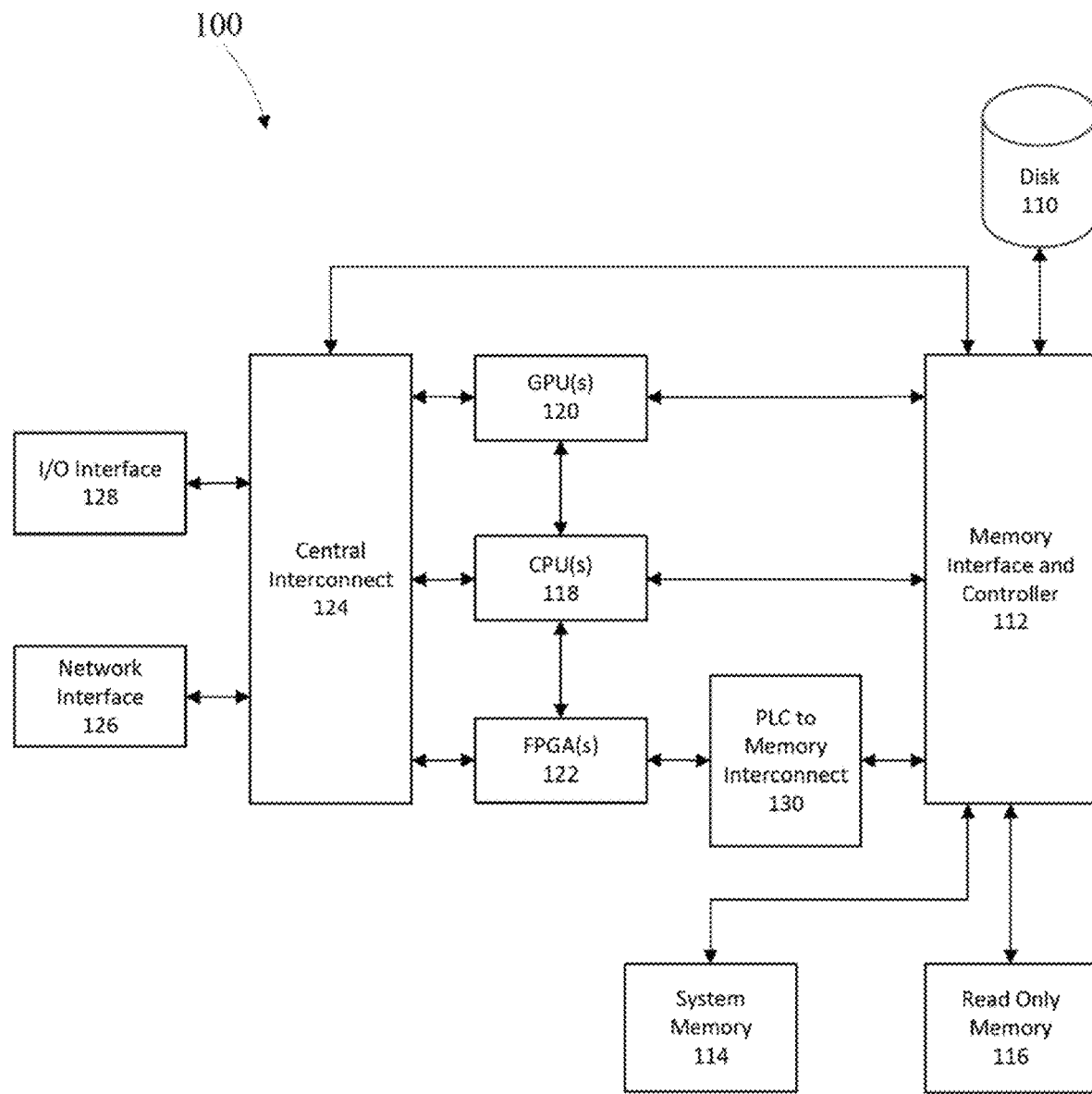
FIG. 1 is a first example system diagram in accordance with one embodiment of the disclosure.

FIG. 1 depicts an example hybrid computational system 100 that may be used to implement neural nets associated with the operation of one or more portions or steps of process 600. In this example, the processors associated with the hybrid system comprise a field programmable gate array (FPGA) 122, a graphical processor unit (GPU) 120 and a central processing unit (CPU) 118.

The CPU 118, GPU 120 and FPGA 122 have the capability of providing a neural net. A CPU is a general processor that may perform many different functions, its generality leads to the ability to perform multiple different tasks, however, its processing of multiple streams of data is limited and its function with respect to neural networks is limited. A GPU is a graphical processor which has many small processing cores capable of processing parallel tasks in sequence. An FPGA is a field programmable device, it has the ability to be reconfigured and perform in hardwired circuit fashion any function that may be programmed into a CPU or GPU. Since the programming of an FPGA is in circuit form, its speed is many times faster than a CPU and appreciably faster than a GPU.

There are other types of processors that the system may encompass such as an accelerated processing unit (APUs) which comprise a CPU with GPU elements on chip and digital signal processors (DSPs) which are designed for performing high speed numerical data processing. Application specific integrated circuits (ASICs) may also perform the hardwired functions of an FPGA; however, the lead time to design and produce an ASIC is on the order of quarters of a year, not the quick turn-around implementation that is available in programming an FPGA.

The graphical processor unit 120, central processing unit 118 and field programmable gate arrays 122 are connected and are connected to a memory interface controller 112. The FPGA is connected to the memory interface through a programmable logic circuit to memory interconnect 130. This additional device is utilized due to the fact that the FPGA is operating with a very large bandwidth and to minimize the circuitry utilized from the FPGA to perform memory tasks. The memory and interface controller 112 is additionally connected to persistent memory disk 110, system memory 114 and read only memory (ROM) 116.

The system of FIG. 1A may be utilized for programming and training the FPGA. The GPU functions well with unstructured data and may be utilized for training, once the data has been trained a deterministic inference model may be found and the CPU may program the FPGA with the model data determined by the GPU.

The memory interface and controller is connected to a central interconnect 124, the central interconnect is additionally connected to the GPU 120, CPU 118 and FPGA 122. The central interconnect 124 is additionally connected to the input and output interface 128 and the network interface 126.

Figure 2:
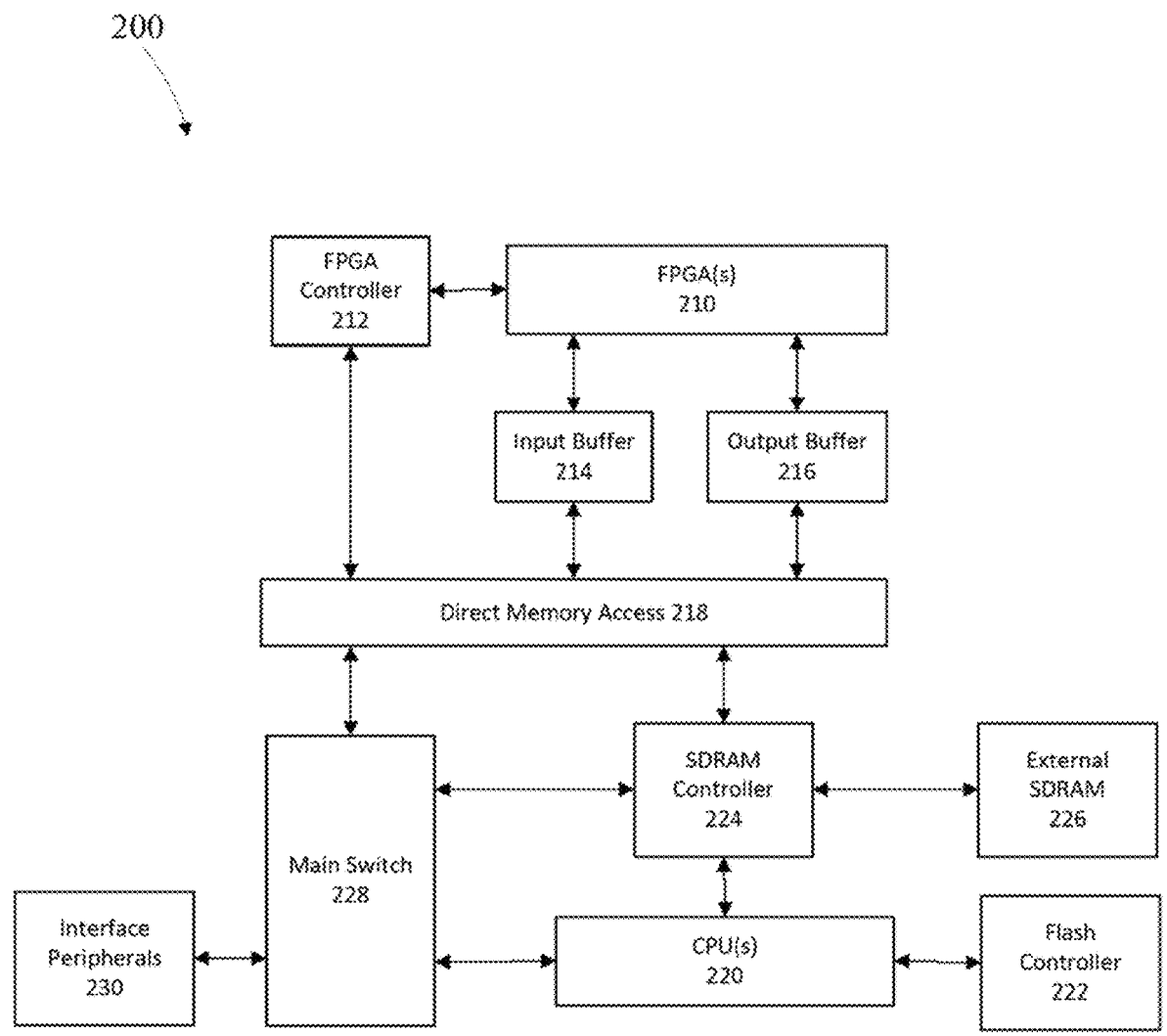
FIG. 2 is a second example system diagram in accordance with one embodiment of the disclosure.

FIG. 2 depicts a second example hybrid computational system 200 that may be used to implement neural nets associated with the operation of one or more portions or steps of process 1000. In this example, the processors associated with the hybrid system comprise a field programmable gate array (FPGA) 210 and a central processing unit (CPU) 220.

The FPGA is electrically connected to an FPGA controller 212 which interfaces with a direct memory access (DMA) 218. The DMA is connected to input buffer 214 and output buffer 216, which are coupled to the FPGA to buffer data into and out of the FPGA respectively. The DMA 218 includes of two first in first out (FIFO) buffers one for the host CPU and the other for the FPGA, the DMA allows data to be written to and read from the appropriate buffer.

On the CPU side of the DMA are a main switch 228 which shuttles data and commands to the DMA. The DMA is also connected to an SDRAM controller 224 which allows data to be shuttled to and from the FPGA to the CPU 220, the SDRAM controller is also connected to external SDRAM 226 and the CPU 220. The main switch 228 is connected to the peripherals interface 230. A flash controller 222 controls persistent memory and is connected to the CPU 220.

The proposed solution is directed to forming a coded spatial light transmittance modulator (SLIM) as part of an image capture device. This image capture device is enabled to extend the dynamic range of the camera. The proposed image capture device may be implemented by placing the coded spatial light transmittance modulator on the protective glass of the sensor. A coded low dynamic range (LDR) image with per-pixel exposure modulation may be remapped on the photodetector. A high dynamic range (HDR) module provides HDR images with minimal modifications to the camera.

The spatial light transmittance modulator may provide shading on a per-pixel basis or may shade regions of M×N pixels. The spatial light transmittance modulator may be provided above the microlens in which case the SLTM may be dynamically adjustable and is termed an SLTM element based configuration, or, alternatively, be provided underneath the microlens in which case the SLTM is an SLTM element based configuration. The term coded indicates that the modulation is fixed and non-adjustable.

The proposed solution may provide an adjustable or coded spatial light transmittance modulator integral to an image sensor device. The device is enabled to perform high dynamic range (HDR) image capture under the circumstances such as sun glare on the road and oncoming headlights during night driving. An adaptive SLTM based image system is provided that enables the SLTM to adjust the transmittance with high resolution, allowing the camera to collect a scene with high dynamic range.

Depending on the position of SLTM element in the light path, the light transmittance image capture device may be described as an SLTM-sensor based configuration in which the transmittance of overexposure region may be adjusted through SLTM-sensor pixel, or an SLTM element-based configuration in which the SLTM element is mounted on the main lens system and the transmittance map on the SLTM element may be dynamically adjusted.

Figure 3:
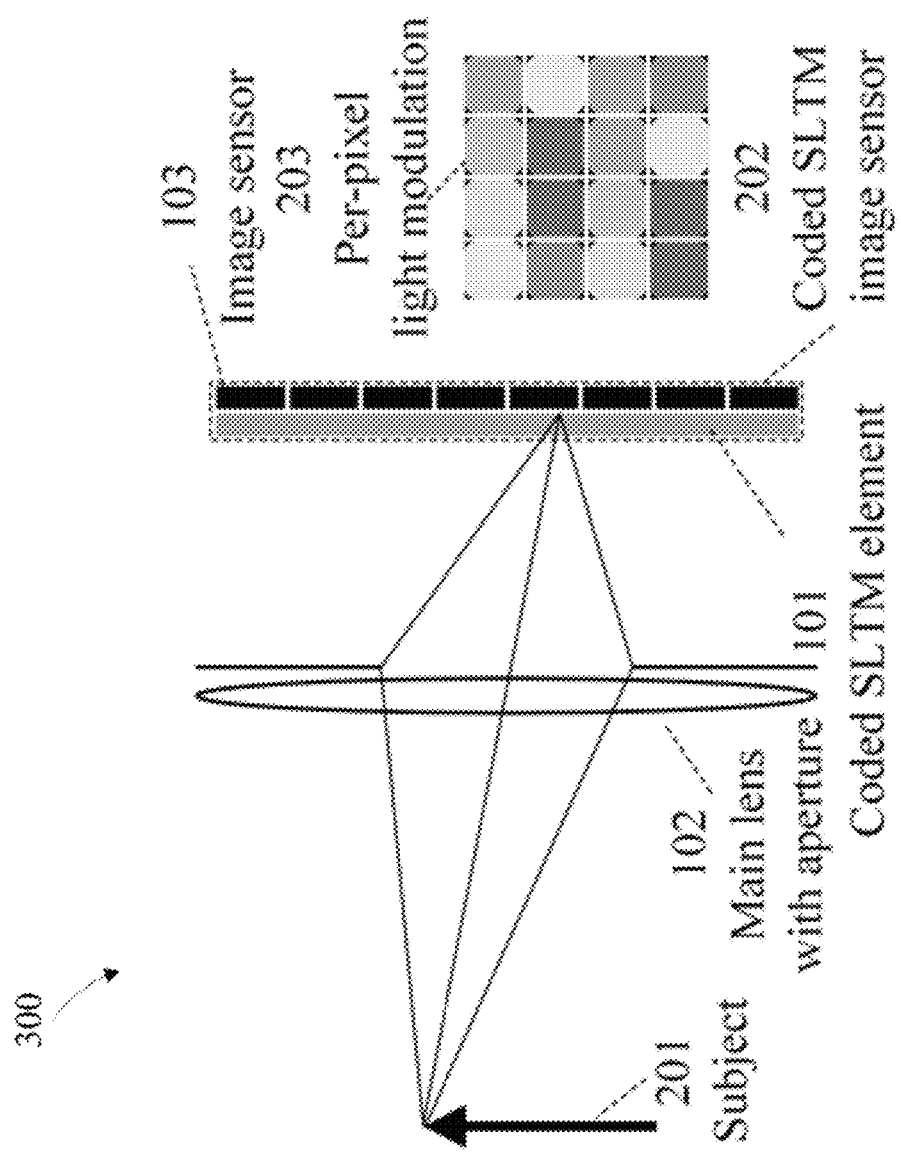
FIG. 3 depicts a first example spatial light transmittance modulator (SLTM)-sensor based camera in accordance with one embodiment of the disclosure.

FIG. 3 depicts an example architecture of a coded spatial light transmittance modulator image sensor based imaging system. The spatial light transmittance modulator (SLTM) element 101 is affixed so as to modulate the intensity of light impinging upon image sensor 103, the combination of the spatial light transmittance modulator (SLTM) element 101 and the image sensor 103 is the coded SLTM image sensor 202 that produces per pixel light modulation 203. The light beam from subject 201 may be focused by the main lens system 102 to be captured by the coded SLTM image sensor 202. In another example, the modulation may be on a per-region basis covering M×N pixels.

The amount of light captured by the image sensor is limited by the aperture of main lens 102. In this example, the coded SLTM image sensor 202 includes a coded SLTM element 101 and the image sensor 103. The coded SLTM element 101 provides a per-pixel light modulated LDR image. In this example per-pixel modulation is depicted by per pixel light modulation 203 element. The combination of the coded SLTM element 101 and image sensor 103 is termed a coded SLTM image sensor 202.

One skilled in the art will recognize that the image sensor 103 is not limited by the placement or the specific grayscale of the coded SLTM element 101 and other coded SLTM elements may be utilized. As shown in FIG. 3, the coded per pixel light modulation 203 may be mapped to the photodetector pixel array. In other embodiments, the light modulation may be on a per-region basis rather than a per-pixel modulation.

The example imaging system may be based on a coded spatial light transmittance modulator constructed for high dynamic range imaging detection with a single shot exposure. The camera may include a main lens system 102 and a coded SLTM element 101 mask that is integrated or mounted onto the image sensor 103.

Figure 4:
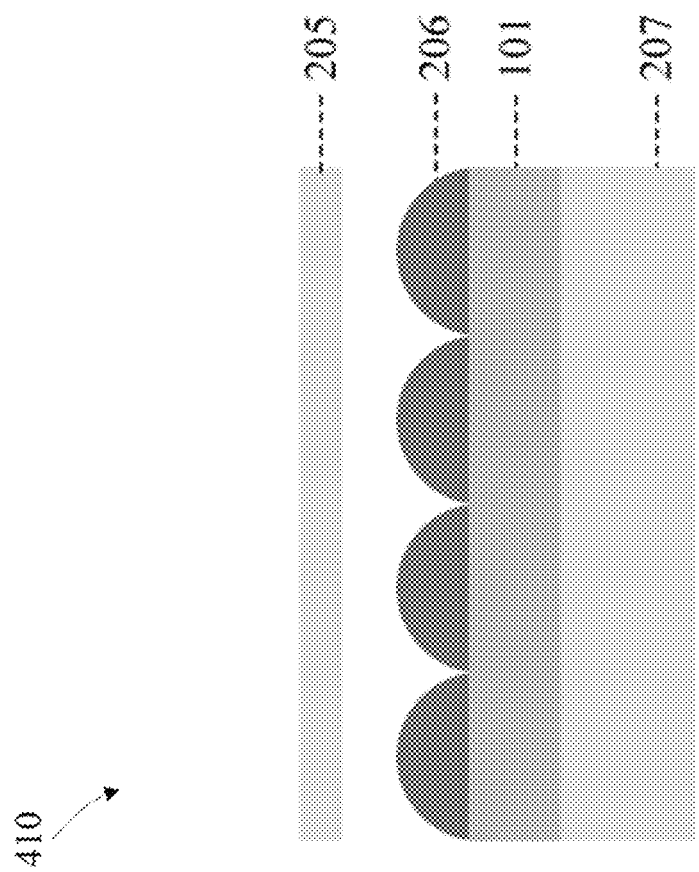
FIG. 4 depicts an example cross-sectional view of the structure of SLTM sensor where the SLTM element is beneath the microlens array of image sensor in accordance with one embodiment of the disclosure.

FIG. 4 depicts a first example cross-sectional view of the coded SLTM image sensor 202. The coded SLTM element 101 is formed on the chip between the microlens layer 206 and the pixel array 207. In this example the cover glass 205 is plain. The image sensor architecture is not limited to back side illuminated image sensor devices and may be extended to other types of image sensor devices.

Figure 5:
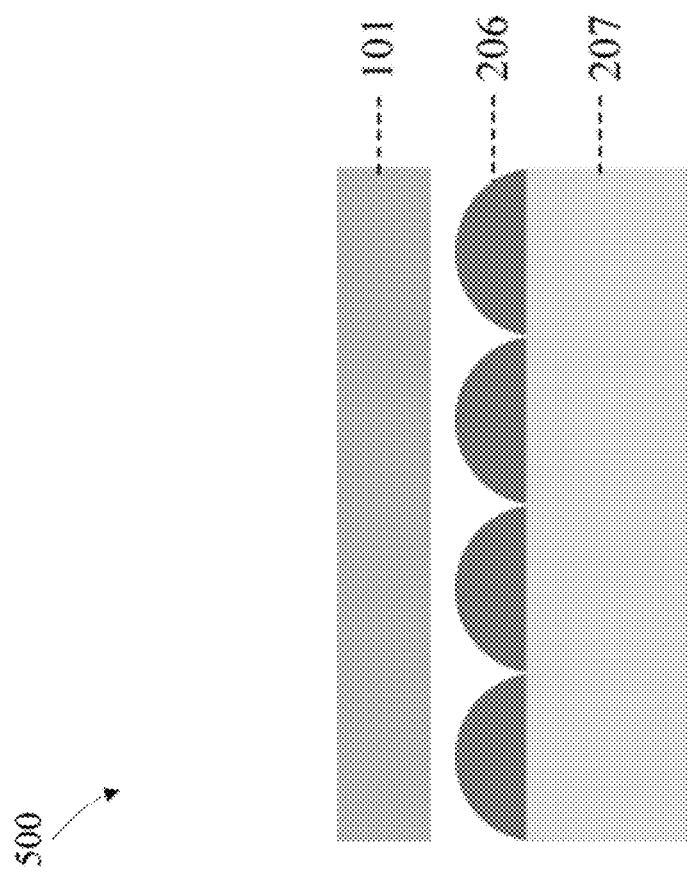
FIG. 5 depicts an example cross-sectional view of the structure of SLTM sensor where the SLTM element is above the microlens array of image sensor in accordance with one embodiment of the disclosure.

FIG. 5 depicts a second example cross-sectional view of the coded SLTM image sensor 202 in which, the cover glass 205 may be a coded SLTM element 101. The coded SLTM element 101 is located above the microlens layer 206 and the pixel array 207. The term coded indicates that the modulation is fixed and non-adjustable.

Figure 6:
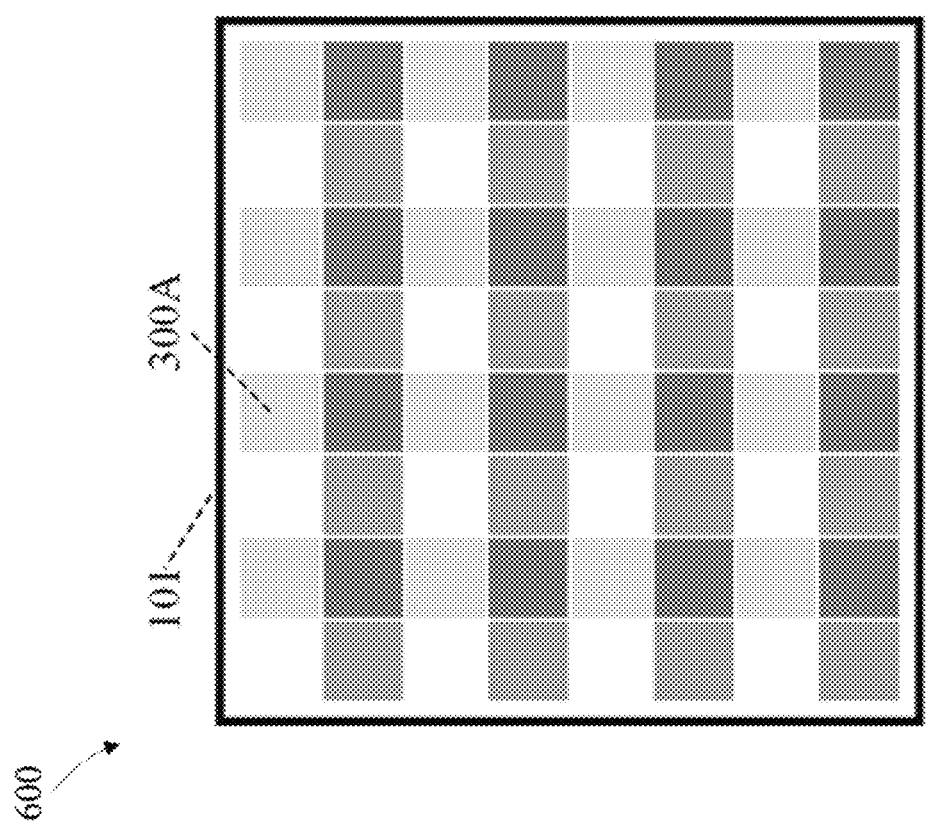
FIG. 6 depicts an example top view of coded spatial light transmittance modulator with varying transmittance in accordance with one embodiment of the disclosure.

Referring to FIG. 6, there is a top view of a coded spatial light transmittance modulator with varying grayscale to create a high dynamic range (HDR) image with a single shot. The arrangement of transmittance pattern is not limited to the proposed pattern shown in FIG. 6. Other patterns such as a uniform distribution pattern, random binary pattern, and the like may be used as the HDR mask. Light reflected from the subject passes through the main lens system (FIG. 3, 102) and the coded SLTM element (FIG. 3, 101) mask to the image sensor (FIG. 3, 103) yielding a per-pixel intensity modulation of the captured image. The coded LDR raw image may be used to reconstruct an HDR image with the reconstruction module.

Figure 7:
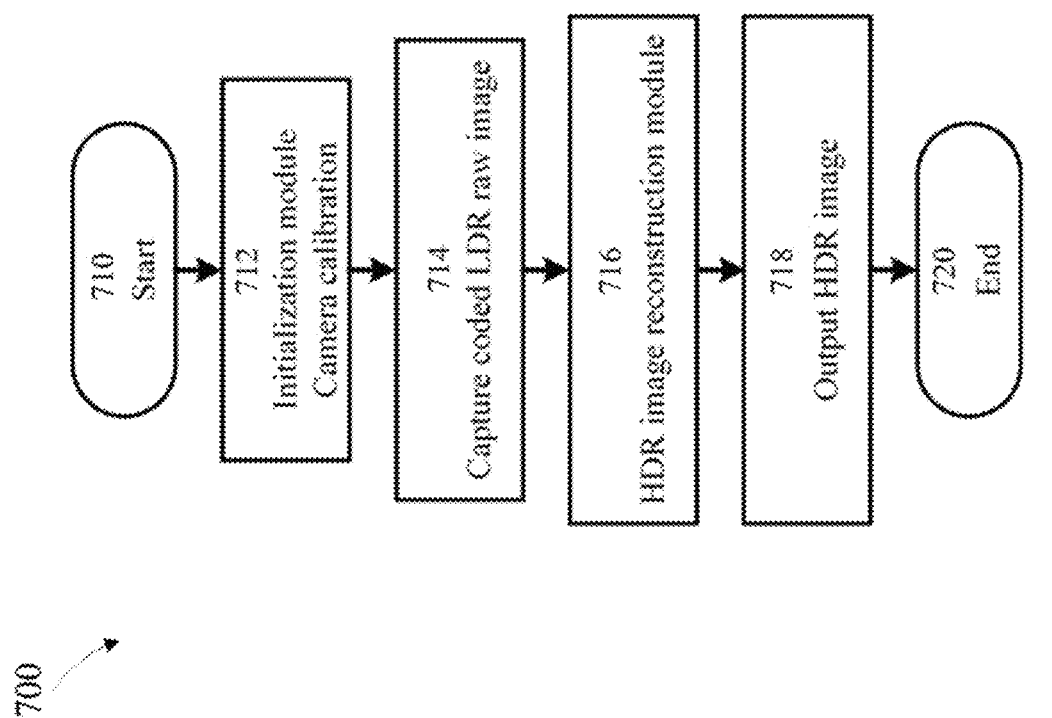
FIG. 7 depicts a first example method for high dynamic image acquisition in accordance with one embodiment of the disclosure.

FIG. 7 depicts an example method for high dynamic image (HDR) acquisition and reconstruction. The imaging system is initialized 710 and the camera calibrated 712 to obtain a coded transmittance mask in the image raw data. This transmittance mask may be pre-calibrated using an in-system calibration module. The coded SLTM element 101 mask may provide the coded LDR image raw data 714 with spatially varying exposures, and the HDR image reconstruction module 716 may reconstruct an HDR image from the coded LDR image raw data 714 and the HDR image is output 718.

Figure 8:
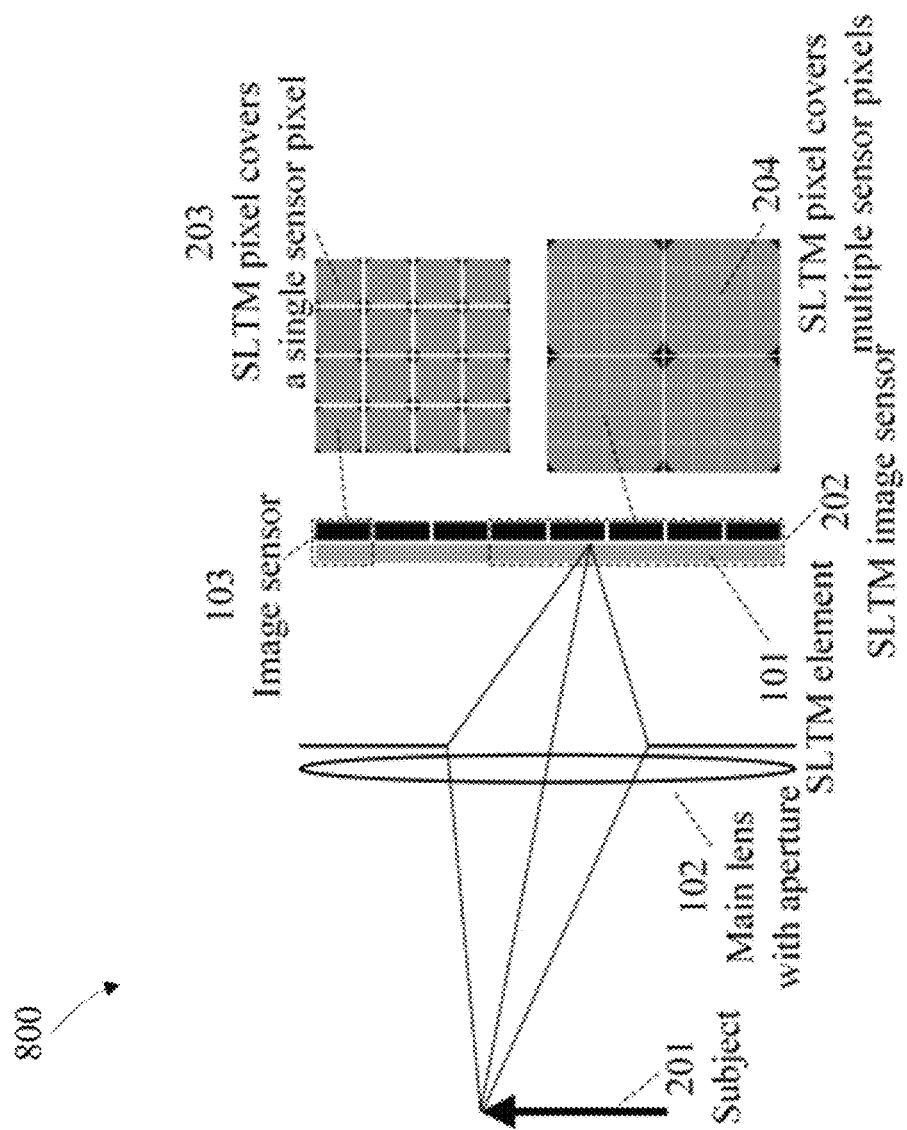
FIG. 8 depicts a second example SLTM-sensor based camera in accordance with one embodiment of the disclosure.

FIG. 8 depicts a second example architecture of an SLTM-sensor based imaging system. Other components may additionally or alternatively be added. The incoming light beam from subject 201 is focused by the main lens system 102 to be captured by the SLTM image sensor 202. The amount of light captured by the camera is limited by the aperture of main lens. The SLTM image sensor 202 comprises SLTM element 101 and image sensor 103. The SLTM element 101 may provide a dynamic transmittance based on overexposed pixels. One skilled in the art will recognize that the image sensor 103 is not limited by the SLTM element 101 and the pixel size of SLTM may be adjusted to include per pixel light modulation 203 or a per region light modulation 204. As shown in FIG. 8, the SLTM may cover one or more image sensor pixels such as per pixel light modulation 203 or per region light modulation 204. A scene with a high dynamic range may be remapped on the SLTM image sensor 202.

Figure 9:
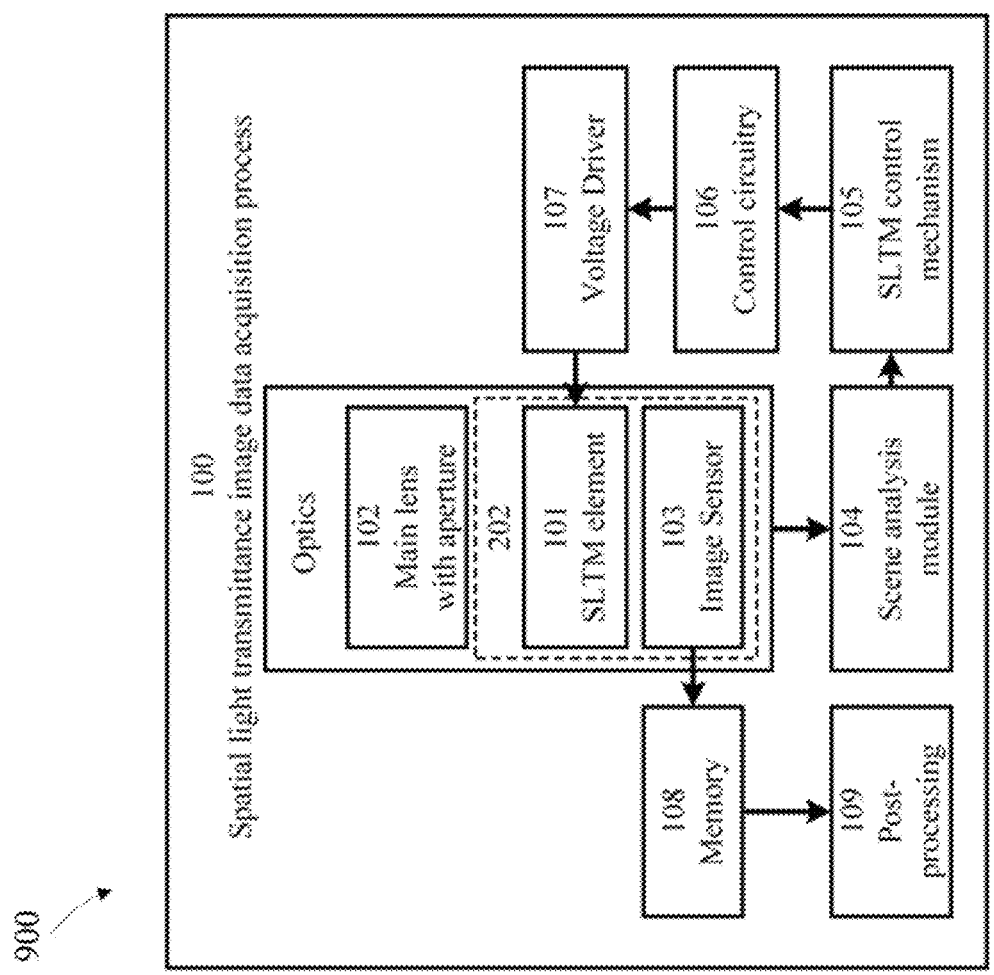
FIG. 9 depicts a first example architecture for a SLTM image data acquisition device in accordance with one embodiment of the disclosure.

FIG. 9 depicts a first example architecture for spatial light transmittance image data acquisition 900 that includes optics such as a main lens system (FIG. 8, 102) and a SLTM image sensor (FIG. 8, 202) having an SLTM element (FIG. 8, 101) and an image sensor (FIG. 8, 103). Scene analysis module 104 receives data from the image sensor 103. SLTM control module 105 receives data from the scene analysis module 104. Control circuitry 106 receives data from the SLTM control module and feeds data to the voltage driver, 107 which is sent to the SLTM element (FIG. 8, 101). Data from memory 108 is received from image sensor (FIG. 8, 103) and sends data to the post-processing module 109. The scene analysis module 104 analyzes the scene for areas of overexposure and determines the addresses of the overexposure pixels. The control circuitry 106 and voltage driver 107 adjusts the spatial transmittance arrangement of SLTM-senor. The results may be stored in memory 108 and sent to the post-processing module 109.

Figure 10:
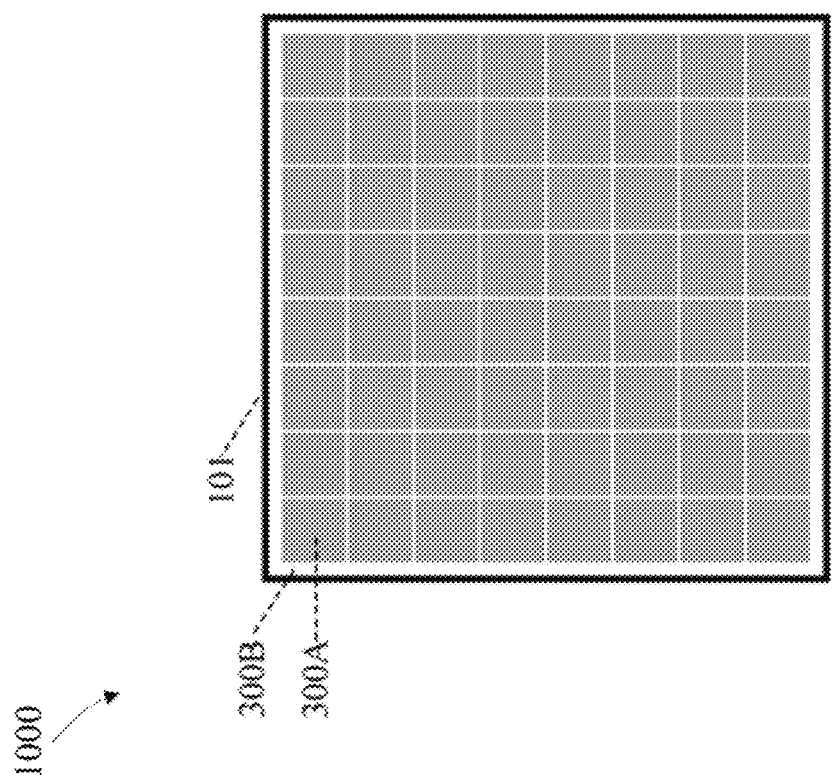
FIG. 10 depicts a second example top view of SLTM element structure in accordance with one embodiment of the disclosure.

FIG. 10 depicts an example top view of an SLTM element 101 grid structure. The arrangement of SLTM pixel 300A in SLTM element 101 grid structure may be rearranged. The SLTM pixel may cover a single image sensor pixel or an area encompassing multiple image sensor pixels, element 300B denotes the control circuitry.

Figure 11:
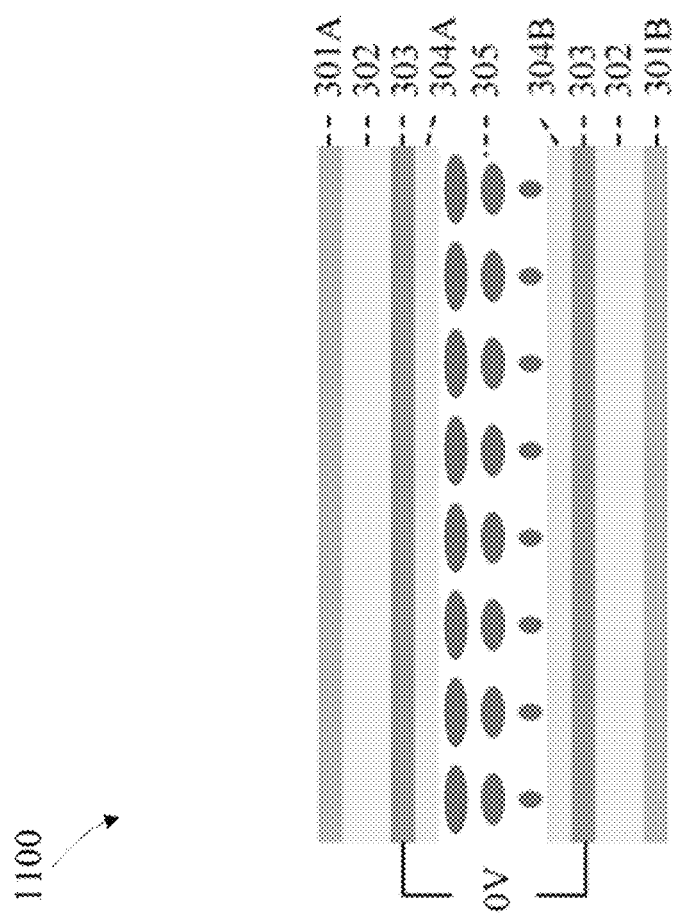
FIG. 11 depicts a first example cross-sectional view of an adjustable SLTM pixel which is defined in liquid crystal in accordance with one embodiment of the disclosure.
Figure 12:
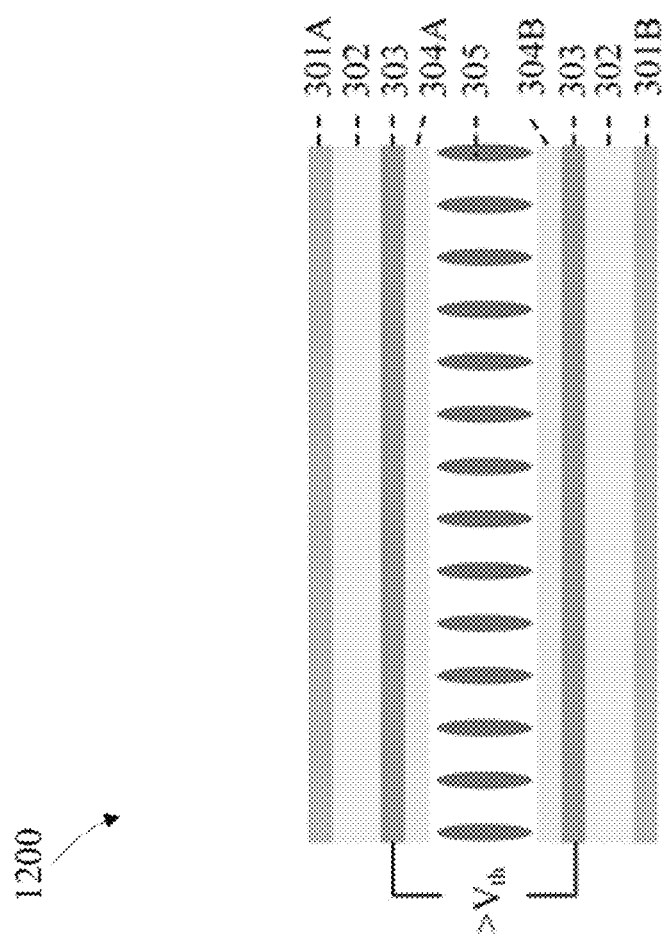
FIG. 12 depicts a second example cross-sectional view of an adjustable SLTM pixel which is defined in liquid crystal in accordance with one embodiment of the disclosure.

FIGS. 11 and 12, depict cross-sectional views of an adjustable SLTM pixel 300A which is based on liquid crystal 305. In this example there are polarizers 301A and 301B and an Indium tin oxide (ITO) coated glass cell, ITO layers 303 or some other suitable material may be used as a conductor. The ITO layers 303 have alignment layers 304A and 304B. The alignment layers are perpendicular to each other to form a twisted-nematic cell. The glass substrates 302 may be replaced by other suitable materials. A twisted nematic cell contains a nematic liquid crystal that is confined between two plates of polarized glass. A twisted nematic effect is based on a controlled realignment of the nematic liquid crystal between different molecular configurations based on an applied electrical field. When the polarizers 301A and 301B are parallel or perpendicular to one another, a driving voltage is applied to the adjustable SLTM pixel.

When no voltage is applied to the twisted-nematic cell, the liquid molecules form an initial arrangement. Modifying the driving voltage allows adjustment of the SLTM pixel to on and off states. As the driving voltage is increased the liquid crystal molecules are rearranged and the transmittance of adjustable SLTM pixel may continuously adjustable between 0 and 1. One skilled in the art will recognize that the adjustable SLTM element 101 is not limited by the liquid crystal and may be replaced by any materials that can adjust the transmittance.

Figure 13:
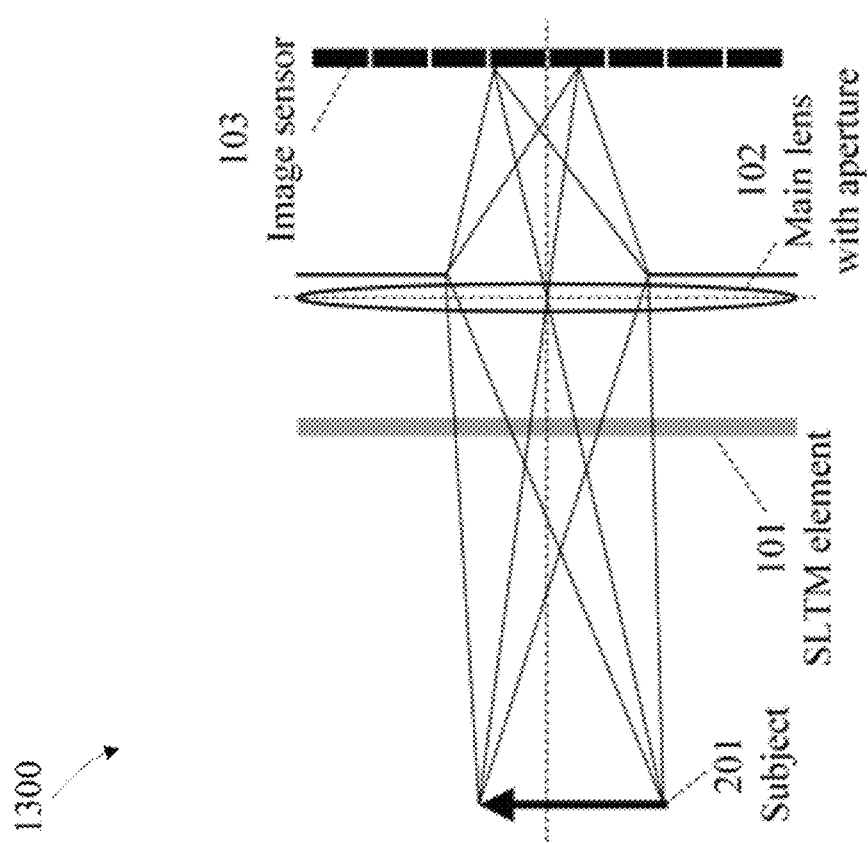
FIG. 13 depicts a second example architecture for a camera with a SLIM element mounted on the main lens system in accordance with one embodiment of the disclosure.

FIG. 13 depicts an example imaging system with an SLTM element 101 mounted before the main lens system, other components may additionally or alternatively added. The incoming light beam reflected off of subject 201 passes through the SLTM element 101 and the main lens system 102 to be captured by image sensor 103. The amount of light captured is limited by the aperture of main lens and an adjustable or coded spatial light transmittance modulator (SLTM) element 101. The SLTM element 101 may provide a dynamic transmittance based on overexposed pixels within the image. One skilled in the art will recognize that the SLTM element 101 and the pixel size of SLTM may be adjusted. As shown in FIG. 13, the SLTM element may be integrated with the main lens system. A scene with a high dynamic range may be mapped to the image sensor 103.

Figure 14:
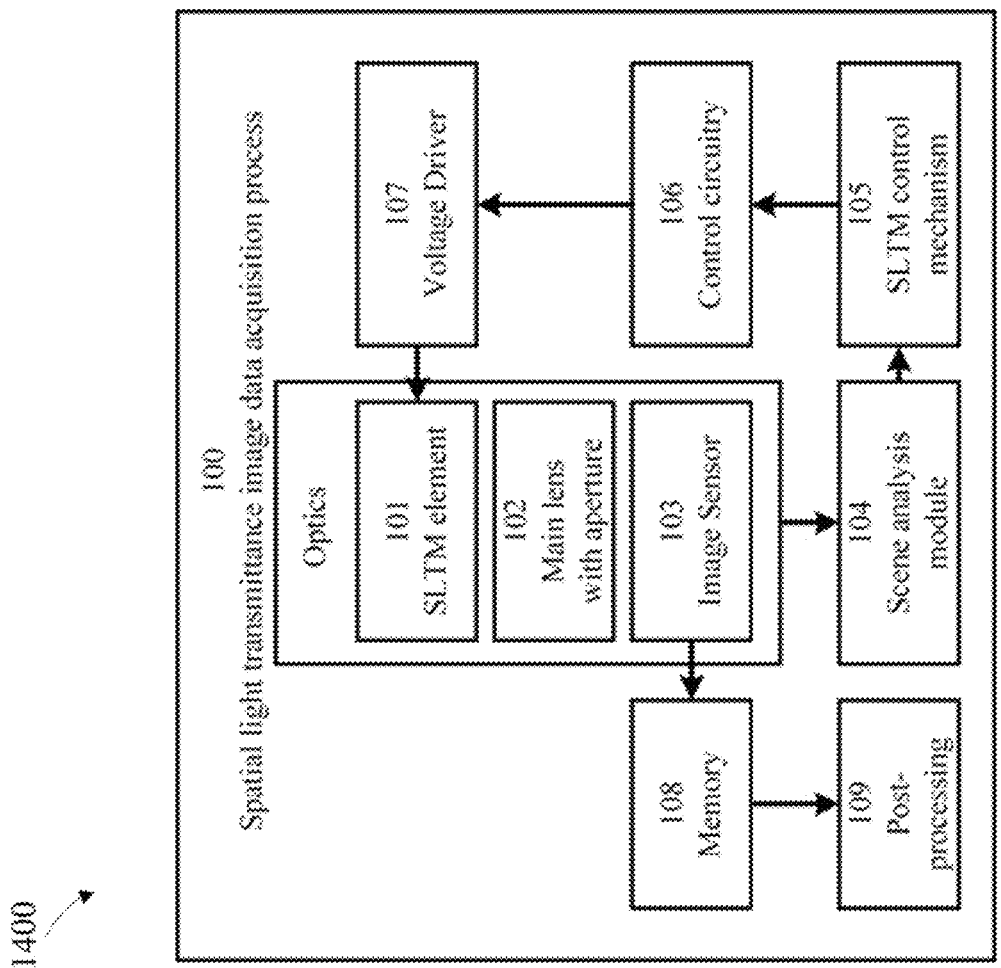
FIG. 14 depicts a second example architecture for a SLTM image data acquisition device in accordance with one embodiment of the disclosure.

FIG. 14 depicts a second example architecture for spatial light transmittance image data acquisition 1400 that includes optics such as a main lens system (FIG. 13, 102) integrated with a SLTM element (FIG. 13, 101) and an image sensor (FIG. 13, 103), scene analysis module 104, SLTM control module 105, control circuitry 106, voltage driver 107 sent to SLTM element 101, memory 108 receiving data from image sensor 103, and post-processing module 109 receiving data from the memory 108. The optics component has been previously illustrated in FIG. 13. The scene analysis module 104 receives data from the image sensor 103, the scene analysis module 104 selects the scene with a large overexposed area and determines the addresses of overexposed pixels. The SLTM control module 105 receives data from the scene analysis module 104, where the SLTM control module 105 provides the control schema. The control circuitry 106 receives data from the SLTM control module 105 and voltage driver 107 receives data from the control circuitry 106 and adjusts the spatial transmittance arrangement of SLTM-senor to achieve a high dynamic range image. The results may be stored to memory 108 and sent to the post-processing module 109.

Figure 15:
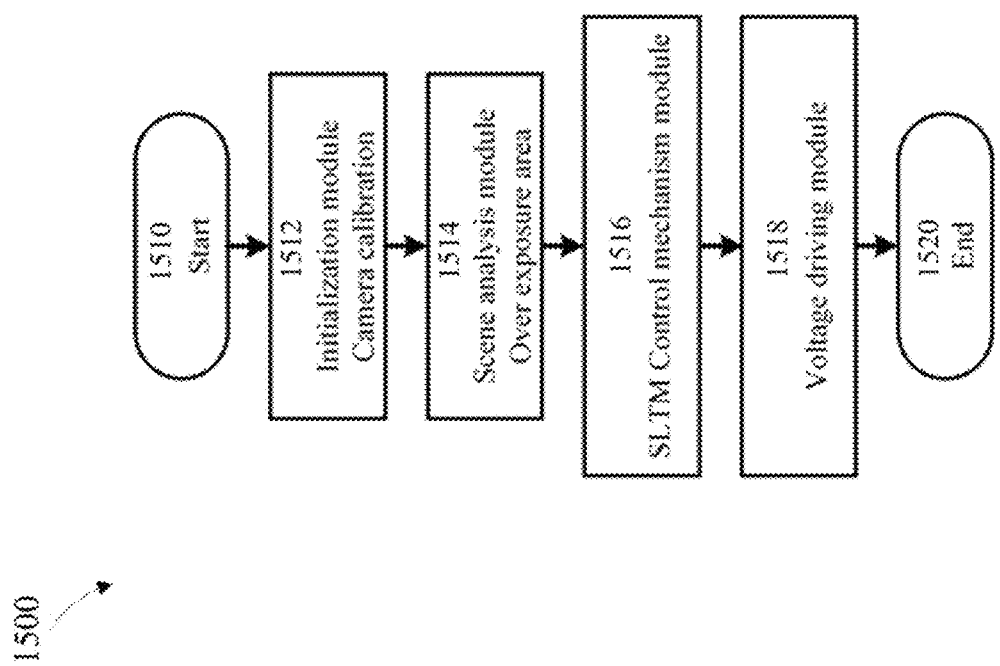
FIG. 15 depicts a second example method for high dynamic image acquisition in accordance with one embodiment of the disclosure.

FIG. 15 depicts a first flowchart of an example method for high dynamic image acquisition. The imaging system is initialized 1510 with camera calibration 1512 to a default transmittance map. This transmittance may be preset, or may be same as the last time used, and the like. Scene analysis module 1514 may provide an approximation of overexposed regions that reduce the image sensor performance, and the SLTM control module 1516 may provide control signals to voltage driving module 1518.

Figure 16:
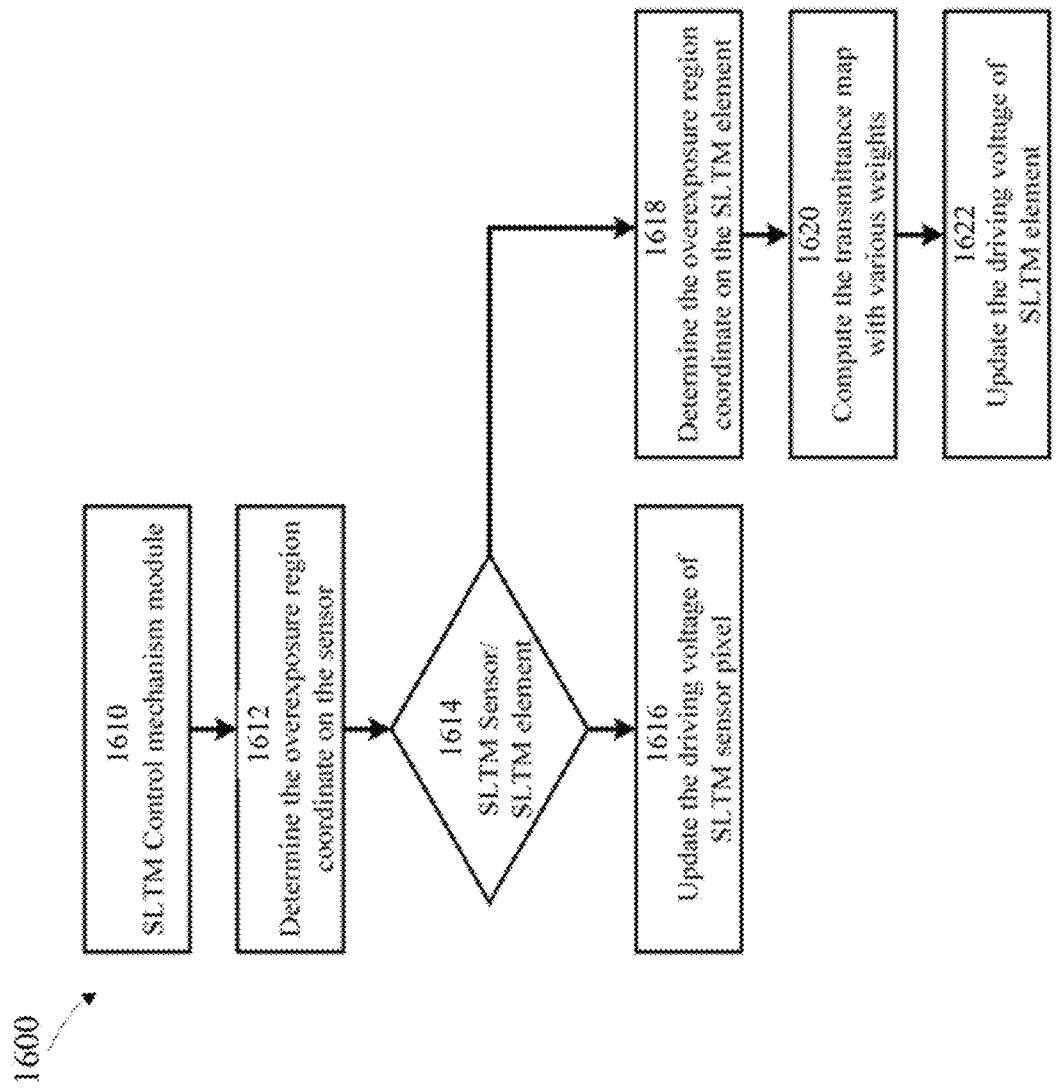
FIG. 16 depicts a first example SLTM control module for imaging system based on an SLTM sensor or an SLTM element in accordance with one embodiment of the disclosure.

FIG. 16 depicts a flowchart of the SLTM control for two different imaging systems based on whether the system is configured as an SLTM sensor or SLIM element. The SLIM control module 1610 determines coordinates of overexposure pixels 1612. The system determines 1614 whether SLTM is implemented as a sensor or an element. If it is determined that the SLTM implementation is by sensor, the driving voltage of the SLTM sensor pixel is updated 1616. If the imaging system implementation is based on an SLIM sensor, a high dynamic range image may be obtained by adjusting the pixel transmittance directly.

If the SLTM element is mounted on the main lens, the coordinates of overexposed pixels of the SLTM element may be determined 1618. The transmittance map of SLTM element may be determined 1620 and a fine-tuned image may be mapped to the image sensor via updating the driving voltage of SLTM element 1622.

Figure 17:
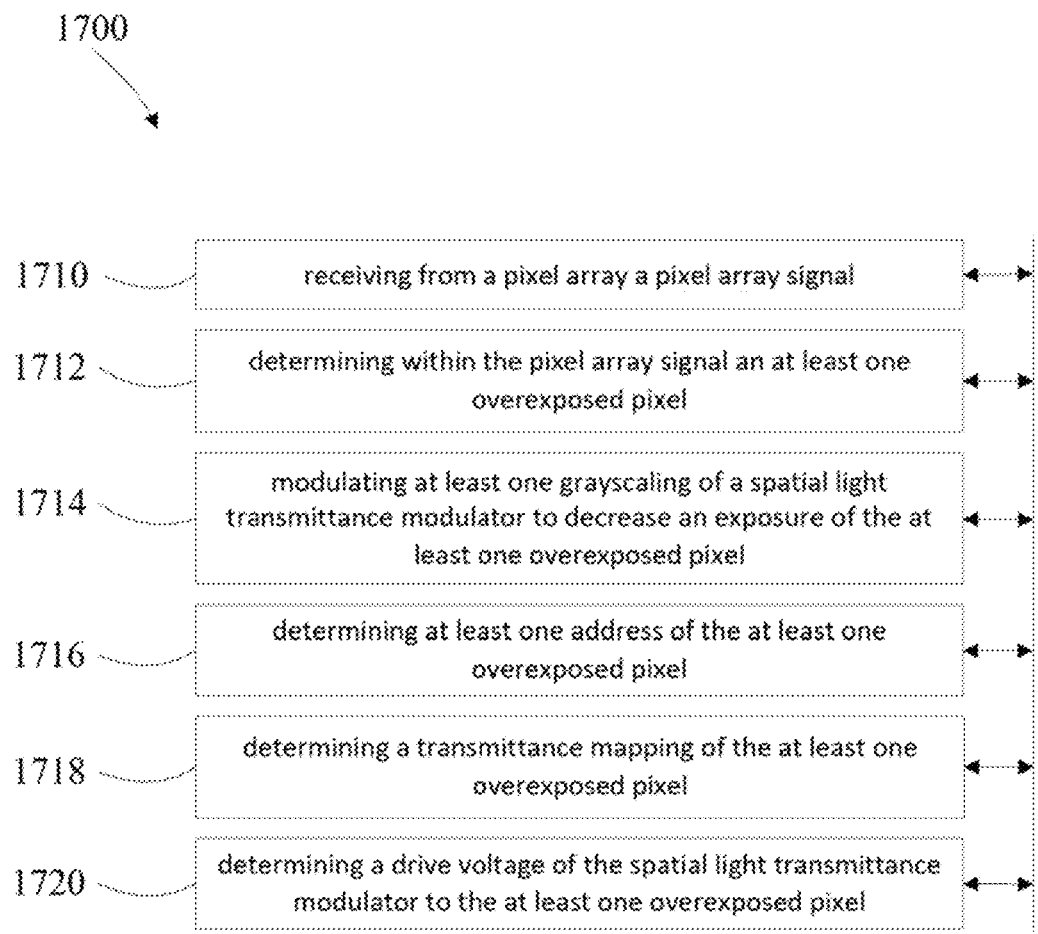
FIG. 17 depicts a third example method for high dynamic image acquisition.

FIG. 17 depicts an example method of high dynamic range sensing comprising receiving 1710 from a pixel array a pixel array signal, determining 1712 within the pixel array signal an at least one overexposed pixel and modulating 1714 at least one grayscaling of a spatial light transmittance modulator to decrease an exposure of the at least one overexposed pixel. The method also comprises determining 1716 at least one address of the at least one overexposed pixel, determining 1718 a transmittance mapping of the at least one overexposed pixel and determining 1720 a drive voltage of the spatial light transmittance modulator to the at least one overexposed pixel.

The proposed solution may allow for single shot exposures, which does not utilize motion stabilization or deghosting. The solution may provide flexible, plug-and-play implementation and high frame rates.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the system. Skilled artisans may implement the described functionality in varying ways for each particular application. Various components and blocks may be arranged differently (e.g., arranged in a different order, or partitioned in a different way) without departing from the scope of the subject technology.

It is understood that the specific order or hierarchy of steps in the processes disclosed is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects may be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention. The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

A phrase such as an "aspect" does not imply that such aspect is essential to the subject technology or that such aspect applies to configurations of the subject technology. A disclosure relating to an aspect may apply to configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to configurations of the subject technology. A disclosure relating to an embodiment may apply to embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to configurations of the subject technology. A disclosure relating to a configuration may apply to configurations, or one or more configurations. A configuration may provide one or more examples. A phrase such as a "configuration" may refer to one or more configurations and vice versa.

The word "example" is used herein to mean "serving as an example or illustration." Any aspect or design described herein as "example" is not necessarily to be construed as preferred or advantageous over other aspects or designs.

Structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

References to "one embodiment," "an embodiment," "some embodiments," "various embodiments", or the like indicate that a particular element or characteristic is included in at least one embodiment of the invention. Although the phrases may appear in various places, the phrases do not necessarily refer to the same embodiment. In conjunction with the present disclosure, those skilled in the art may be able to design and incorporate any one of the variety of mechanisms suitable for accomplishing the above described functionalities.

It is to be understood that the disclosure teaches just one example of the illustrative embodiment and that many variations of the invention may easily be devised by those skilled in the art after reading this disclosure and that the scope of then present invention is to be determined by the following claims.

What is claimed is:

1. A high dynamic range sensor, comprising:
   a pixel array, having a plurality of pixels;
   a spatial light transmittance modulator, the spatial light transmittance modulator having, a plurality of pre-defined shadings,
   the plurality of pre-defined shadings are fixed with respect to the plurality of pixels, wherein
      the plurality of pre-defined shadings is located above the plurality of pixels; and
   a micro-lens array, having a plurality of micro-lens aligned to at least one of the plurality of pixels, wherein the micro-lens array is located above the plurality of pixels, wherein the spatial light transmittance modulator is located above the micro-lens array.

2. The high dynamic range sensor of claim 1, wherein the spatial light transmittance modulator is a twisted nematic.

3. The high dynamic range sensor of claim 1, wherein the spatial light transmittance modulator is located below the micro-lens array.

4. The high dynamic range sensor of claim 1, wherein the spatial light transmittance modulator is coded.

5. The high dynamic range sensor of claim 1, wherein the spatial light transmittance modulator the pre-defined shadings includes varying grayscale.

6. The high dynamic range sensor claim 1, wherein the pixel array is mapped to the plurality of pre-defined shadings.

7. The high dynamic range sensor of claim 1, wherein the spatial light transmittance modulator effects regions of the pixel array.

8. The high dynamic range sensor of claim 1, wherein the spatial light transmittance modulator effects individual pixels within the pixel array.

9. A method of high dynamic range sensing, comprising:
   receiving from a pixel array a pixel array signal;
   determining within the pixel array signal an at least one overexposed pixel;
   determining a drive voltage of the spatial light transmittance modulator the at least one overexposed pixel; and
   modulating at least one grayscaling of a spatial light transmittance modulator to decrease an exposure of the at least one overexposed pixel.

10. The method of claim 9, wherein the spatial light transmittance modulator utilizes a twisted nematic effect to implement the at least one grayscaling.

11. The method of claim 9, further comprising mapping the pixel army to the spatial light transmittance modulator.

12. The method of claim 9, further comprising determining at least one address of the at least one overexposed pixel.

13. The method of claim 9, further comprising determining a transmittance mapping of the at least one overexposed pixel.

14. The method of claim 11, further comprising determining, a drive voltage of the spatial light transmittance modulator to the at least one overexposed pixel.

* * * * *